United States Patent
Terao

(10) Patent No.: US 11,681,216 B2
(45) Date of Patent: Jun. 20, 2023

(54) IMPRINT APPARATUS, IMPRINT METHOD, ARTICLE MANUFACTURING METHOD, MOLDING APPARATUS, AND MOLDING METHOD

(71) Applicant: CANON KABUSHIKI KAISHA, Tokyo (JP)

(72) Inventor: Tsutomu Terao, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 977 days.

(21) Appl. No.: 16/105,137

(22) Filed: Aug. 20, 2018

(65) Prior Publication Data

US 2019/0061207 A1 Feb. 28, 2019

(30) Foreign Application Priority Data

Aug. 25, 2017 (JP) .............................. JP2017-162694
Jul. 6, 2018 (JP) .............................. JP2018-129469

(51) Int. Cl.
| | |
|---|---|
| G03F 7/00 | (2006.01) |
| B29C 43/58 | (2006.01) |
| B29C 59/02 | (2006.01) |
| B29L 31/34 | (2006.01) |

(52) U.S. Cl.
CPC ............ *G03F 7/0002* (2013.01); *B29C 43/58* (2013.01); *B29C 2043/585* (2013.01); *B29C 2043/5891* (2013.01); *B29C 2059/023* (2013.01); *B29L 2031/3425* (2013.01)

(58) Field of Classification Search
CPC .. B29C 59/02; B29C 2059/023; G03F 7/0002
See application file for complete search history.

(56) References Cited

U.S. PATENT DOCUMENTS

2008/0079763 A1* 4/2008 Abrott .................... B41J 29/393
347/19
2015/0179532 A1* 6/2015 Lin ........................ H01L 21/027
438/16

(Continued)

FOREIGN PATENT DOCUMENTS

| JP | 2003282247 A | * | 10/2003 |
| JP | 2011121293 A | * | 6/2011 |
| JP | 2016111335 A | | 6/2016 |

*Primary Examiner* — Jerzi H Moreno Hernandez
(74) *Attorney, Agent, or Firm* — Rossi, Kimms & McDowell LLP

(57) ABSTRACT

An apparatus forms a pattern of an imprint material by curing the imprint material in a state in which the imprint material on a pattern formation region of a member, where a pattern is to be formed, is in contact with a pattern region of a mold. The apparatus includes a dispenser for placing the imprint material on the pattern formation region of the member and a non-pattern formation region of the member, outside the pattern formation region, a detector for detecting the non-pattern formation region in a state in which the imprint material has been placed on the pattern formation region and the non-pattern formation region by the dispenser, and a controller for performing processing for determining an abnormality in the dispenser based on a detection result of the non-pattern formation region by the detector.

28 Claims, 10 Drawing Sheets

(56) References Cited

U.S. PATENT DOCUMENTS

| | | | |
|---|---|---|---|
| 2015/0224703 A1* | 8/2015 | Oda | G03F 7/0002 264/447 |
| 2015/0360394 A1* | 12/2015 | Yamashita | G03F 7/0002 264/39 |
| 2016/0158978 A1* | 6/2016 | Aihara | B29C 59/02 264/40.5 |
| 2016/0167261 A1* | 6/2016 | Aihara | G03F 7/0002 264/408 |
| 2016/0236381 A1* | 8/2016 | Takemura | B29C 43/021 |
| 2017/0235221 A1* | 8/2017 | Nagai | B29C 59/026 264/40.1 |
| 2018/0319175 A1* | 11/2018 | Gazala | B41J 2/2142 |

\* cited by examiner

IMPRINT APPARATUS, IMPRINT METHOD, ARTICLE MANUFACTURING METHOD, MOLDING APPARATUS, AND MOLDING METHOD

BACKGROUND OF THE INVENTION

Field of the Invention

The present invention relates to an imprint apparatus, an imprint method, an article manufacturing method, a molding apparatus, and a molding method.

Description of the Related Art

An imprint apparatus forms a pattern made of a cured product of an imprint material on a member by arranging the imprint material on a pattern formation region of the member using a dispenser, bringing a pattern region of a mold into contact with the imprint material, and curing the imprint material. The mold can also be referred to as a template or an original. If there is an abnormality in the dispenser, the imprint material is not arranged correctly on the pattern formation region of the member, and thus a pattern including a defect may be formed.

Japanese Patent Laid-Open No. 2016-111335 describes a technique in which after supplying an imprint material onto a substrate using a dispenser, it is determined whether there is an omission of the imprint material, by observing the imprint material through a mold by an observation unit. If, as a result of the determination processing, no abnormality is discovered, the process transits to processing of bringing the mold into contact with the imprint material on the substrate and curing the imprint material.

SUMMARY OF THE INVENTION

The present invention provides a technique advantageous in detecting an abnormality in a dispenser.

One of aspects of the present invention provides an imprint apparatus for forming a pattern of an imprint material by curing the imprint material in a state in which the imprint material on a pattern formation region of a member, where a pattern is to be formed, is in contact with a pattern region of a mold, the apparatus comprising: a dispenser configured to place the imprint material on the pattern formation region of the member and a non-pattern formation region of the member, outside the pattern formation region; a detector configured to detect the non-pattern formation region in a state in which the imprint material has been placed on the pattern formation region and the non-pattern formation region by the dispenser; and a controller configured to perform processing for determining an abnormality in the dispenser based on a detection result of the non-pattern formation region by the detector.

Further features of the present invention will become apparent from the following description of exemplary embodiments with reference to the attached drawings.

DESCRIPTION OF THE EMBODIMENTS

The present invention will be described below with reference to the accompanying drawings by way of exemplary embodiments.

Figure 1:
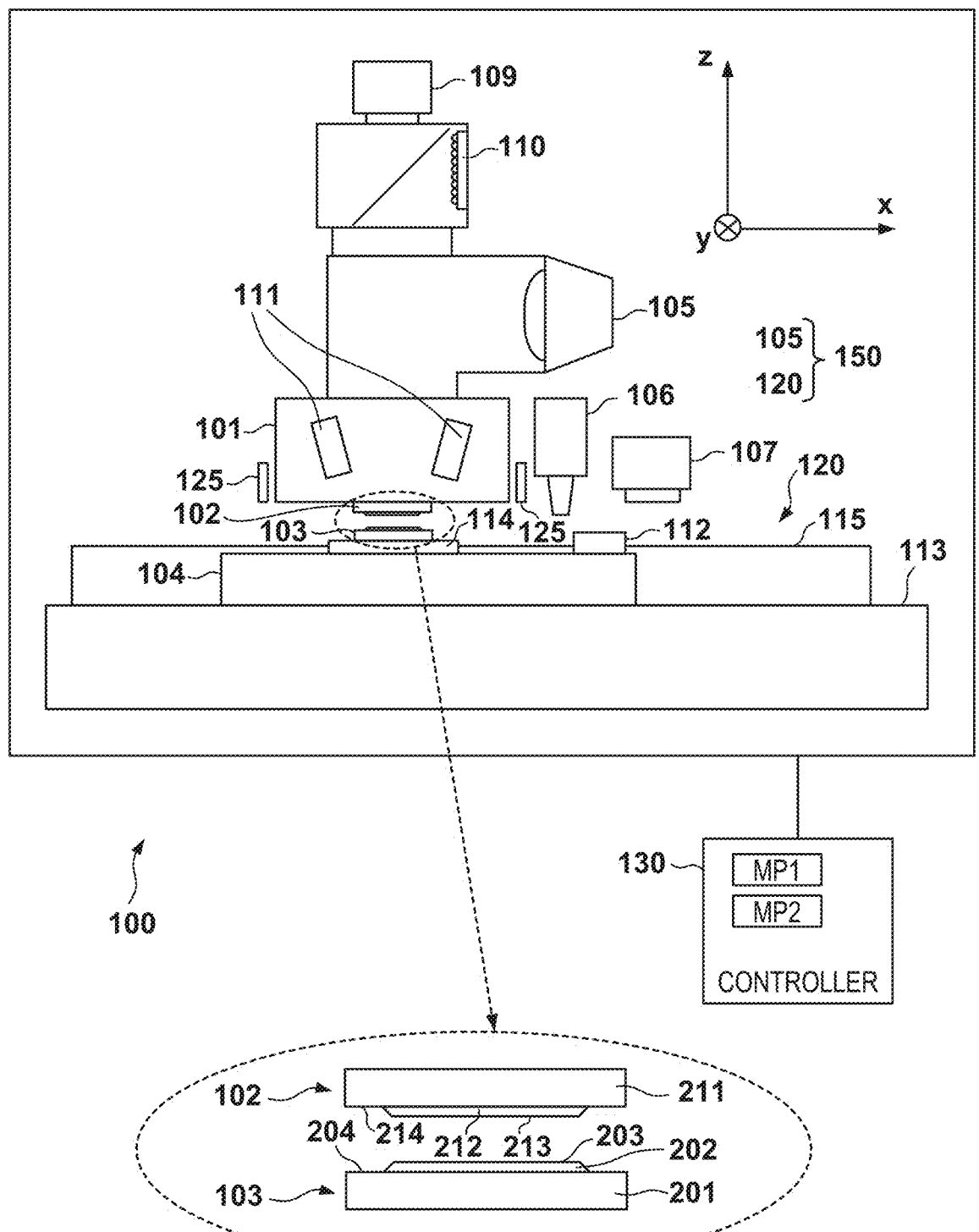
FIG. 1 is a view showing the arrangement of an imprint apparatus according to the first embodiment.

FIG. 1 shows the arrangement of an imprint apparatus 100 according to the first embodiment of the present invention. The imprint apparatus 100 according to the first embodiment is configured to form a replica mold by transferring a pattern of a master mold as a mold 102 to a blank mold as a pattern formation target member 103. However, as will be described later, an imprint apparatus according to the present invention is not limited to such application example, and may be configured to transfer the pattern of the mold 102 onto a substrate such as a semiconductor substrate as the pattern formation target member 103.

The imprint apparatus 100 forms a pattern on a pattern formation region 203 of the member 103 by curing an imprint material on the pattern formation region 203 of the member 103 in a state in which the imprint material and a pattern region 213 of the mold 102 are in contact with each other. The member 103 includes a base portion 201 and a mesa portion 202 that protrudes from the base portion 201, and the surface of the mesa portion 202 forms the pattern formation region 203 which is a single pattern formation region provided to the member 103. The member 103 includes a non-pattern formation region 204 outside the pattern formation region 203 (outside the mesa portion 202). The non-pattern formation region 204 does not contact the pattern region 213 of the mold 102. The mold 102 includes a base portion 211 and a mesa portion 212 that protrudes from the base portion 211, and the surface of the mesa portion 212 forms the pattern region 213. In the pattern region 213, a pattern to be transferred to the pattern formation region 203 of the member 103 is formed. The mold 102 includes a non-pattern region 214 outside the pattern region 213 (outside the mesa portion 212).

A curable composition (to be sometimes referred to as an uncured resin hereinafter) that is cured by receiving curing energy is used as the imprint material. An electromagnetic wave, heat, or the like can be used as the curing energy. The electromagnetic wave can be, for example, light such as infrared light, visible light, or ultraviolet light whose wavelength is selected within a range of 10 nm (inclusive) to 1 mm (inclusive). The curable composition can be a composition that is cured by light irradiation or application of heat. Out of these compositions, a photo-curable composition that is cured by light irradiation contains at least a polymerizable compound and a photopolymerization initiator, and may further contain a non-polymerizable compound or solvent, as needed. The non-polymerizable compound is at least a material selected from the group consisting of a sensitizer, a hydrogen donor, an internal mold release agent, a surfactant, an antioxidant, a polymer component, and the like. The imprint material can be placed or arranged on the substrate in a droplet-like shape, or an island-like shape or a film-like shape formed by a plurality of droplets connected to each other. The viscosity (viscosity at 25° C.) of the imprint material can fall within, for example, a range of 1 mPa·s (inclusive) to 100 mPa·s (inclusive).

In this specification and the accompanying drawings, directions are shown in an X-Y-Z coordinate system in which a direction parallel to the surface of the pattern formation region 203 of the member 103 forms an X-Y plane. Let X, Y, and Z directions be directions parallel to X-, Y-, and Z-axes in the X-Y-Z coordinate system, respectively. Let θX, θY, and θZ be rotation about the X-axis, rotation about the Y-axis, and rotation about the Z-axis, respectively. Control or driving operations with respect to the X-, Y-, and Z-axes indicate control or driving operations with respect to the directions parallel to the X-, Y-, and Z-axes, respectively. Furthermore, control or driving operations with respect to θX-, θY, and θZ-axes indicate control or driving operations with respect to rotation about an axis parallel to the X-axis, rotation about an axis parallel to the Y-axis, and rotation about an axis parallel to the Z-axis, respectively. A position is information that can be specified based on coordinates on the X-, Y-, and Z-axes. An orientation is information that can be specified by values on the θX-, θY-, and θZ-axes. Positioning indicates control of the position and/or orientation. Alignment can include control of the position and/or orientation of at least one of the member 103 and the mold 102.

The imprint apparatus 100 can include a member driving mechanism 120 that holds and drives the member 103. The member driving mechanism 120 can include a stage 104 with a chuck 114 that holds the member 103, a support 113 that supports the stage 104, and a driving mechanism 115 that drives the member 103 by driving the stage 104. In addition, the imprint apparatus 100 can include a mold driving mechanism 101 that holds and drives the mold 102. The member driving mechanism 120 and the mold driving mechanism 101 form a relative driving mechanism 150 that drives at least one of the member 103 and the mold 102 so that the relative positions of the member 103 and the mold 102 are adjusted.

Adjustment of the relative positions by the relative driving mechanism 150 can include contact of the mold 102 with the imprint material on the member 103 and driving for separating the mold 102 from the cured imprint material (a pattern of a cured product). The member driving mechanism 120 can be configured to drive the member 103 with respect to a plurality of axes (for example, three axes of the X-, Y-, and θZ-axes, preferably six axes of the X-, Y-, Z-, θX-, θY-, and θZ-axes). The mold driving mechanism 101 can be configured to drive the mold 102 with respect to a plurality of axes (for example, three axes of the Z-, θX-, and θY-axes, preferably six axes of the X-, Y-, Z-, θX-, θY-, and θZ-axes).

In addition, the imprint apparatus 100 can include a dispenser 106, an off-axis alignment scope 107, a curing unit 105, an image capturing device 109, an image capturing light source 110, on-axis alignment scopes 111, a gas supply unit 125, and a controller 130. The dispenser 106 can be configured or controlled to place or arrange the imprint material on the pattern formation region 203 and the non-pattern formation region 204 out of the surface of the member 103.

The dispenser 106 discharges the imprint material so that the imprint material is placed or arranged on the pattern formation region 203 and the non-pattern formation region 204 in a state in which the member driving mechanism 120 continuously scans the member 103 in a predetermined direction. The off-axis alignment scope 107 is an alignment scope for detecting the position of the alignment mark of the member 103 without intervention of the mold 102. The curing unit 105 cures the imprint material placed or arranged on the member 103 by irradiating the imprint material with curing energy (for example, light such as ultraviolet light). The image capturing device 109 (observation unit and detector) captures (observes and detects) the pattern formation region 203 and the non-pattern formation region 204 via the mold 102.

For image capturing by the image capturing device 109, the image capturing light source 110 illuminates the member 103 with light having a wavelength that does not cure the imprint material. As the wavelength, for example, visible light or infrared light can be used. The image capturing device 109 includes a two-dimensional image sensor such as a CCD image sensor or a CMOS image sensor. If infrared light is used, it is possible to perform image capturing using a near-infrared light camera incorporating an InGaAs device with the sensitivity to infrared light. The imprint material can contain a material that absorbs light in a near-infrared light region. In this case, the presence/absence of the imprint material can be detected as a brightness difference. Alternatively, an image capturing element (polarization camera) in which a polarizing plate is arranged in front of an image sensor. The polarization camera can detect polarized light in a given direction, that has been scattered by an object, and can thus suppress reception of stray light. The on-axis alignment scopes 111 detect the relative positions of the alignment mark of the member 103 and the alignment mark of the mold 102, and detect the positions of the alignment mark of the member 103 and the reference mark of a reference plate 112.

The gas supply unit 125 is arranged around the mold 102, and supplies a purge gas to a portion around the mold 102. As the purge gas, a gas that does not inhibit curing of the imprint material such as a gas that contains at least one of helium gas, nitrogen gas, and a condensable gas (for example, pentafluoropropane (PFP)) can be used. The controller 130 can be formed by, for example, PLD (short for Programmable Logic Device) such as an FPGA (short for Field Programmable Gate Array), an ASIC (short for Application Specific Integrated Circuit), a general-purpose computer with a program installed, or a combination of all or some of them.

Although not shown, the imprint apparatus 100 can include a deformation mechanism that deforms the member 103 to have a shape convex toward the mold 102 by applying a pressure to the back surface of the member 103. In addition, the imprint apparatus 100 can include a deformation mechanism that deforms the mold 102 to have a shape convex toward the member 103 by applying a pressure to the back surface of the mold 102. By providing these deformation mechanisms, the imprint material on the pattern formation region 203 of the member 103 and the pattern region 213 of the mold 102 can be brought into contact with each other at a central portion first. After that, by gradually decreasing the deformation amounts of the member 103 and the mold 102, the contact region between the imprint material and the pattern region 213 of the mold 102 can be enlarged gradually.

The operation of the imprint apparatus 100 according to the first embodiment will be exemplarily described below. The operation to be described below can be controlled by the controller 130. The mold 102 (master mold) is attached to the mold driving mechanism 101. The relative positions of the alignment mark of the mold 102 and the reference mark of the reference plate 112 are detected using the on-axis alignment scopes 111.

The member 103 (blank mold) is conveyed onto the chuck 114 of the stage 104 of the member driving mechanism 120, and held by the chuck 114. Next, the position of the alignment mark of the member 103 and that of the reference mark of the reference plate 112 are detected using the off-axis alignment scope 107, thereby detecting the relative positions of the member 103 (pattern formation region 203) and the reference mark. This obtains the relative positions of the member 103 (pattern formation region 203) and the mold 102. Based on the relative positions of the member 103 (pattern formation region 203) and the mold 102, the member 103 is positioned by the member driving mechanism 120 so that the alignment mark of the member 103 enters the fields of view of the on-axis alignment scopes 111. The relative positions of the alignment mark of the member 103 and the alignment mark of the mold 102 (the relative positions of the pattern formation region 203 of the member 103 and the pattern region 213 of the mold 102) are detected using the on-axis alignment scopes 111. Based on the relative positions, the pattern formation region 203 of the member 103 and the pattern region 213 of the mold 102 can be aligned.

The dispenser 106 places or arranges the imprint material on the pattern formation region 203 and the non-pattern formation region 204 of the member 103. At this time, the dispenser 106 places or arranges the imprint material on the pattern formation region 203 and the non-pattern formation region 204 by discharging the imprint material in the state in which the member driving mechanism 120 continuously scans the member 103 in the predetermined direction.

The member driving mechanism 120 and the mold driving mechanism 101 are controlled so that the pattern formation region 203 of the member 103 and the pattern region 213 of the mold 102 are aligned. At this time, the relative positions of the pattern formation region 203 of the member 103 and the pattern region 213 of the mold 102 may be detected again using the on-axis alignment scopes 111, and the pattern formation region 203 and the pattern region 213 may be aligned based on the relative positions. Alternatively, detection of the relative positions by the on-axis alignment scopes 111 before the dispenser 106 places or arranges the imprint material on the pattern formation region 203 and the non-pattern formation region 204 may be omitted. The imprint apparatus 100 may include a shape correction mechanism, and the shape of the pattern region 213 may be corrected by the shape correction mechanism.

An imprint process of forming a pattern on the pattern formation region 203 of the member 103 and failure detection processing are executed. The imprint process can include a contact step, a filling step, a curing step, and a separation step. The contact step is a step of bringing the imprint material on the pattern formation region 203 of the member 103 and the pattern region 213 of the mold 102 into contact with each other, and can be performed when the controller 130 operates the relative driving mechanism 150. The filling step is a step of filling a concave portion of the pattern region 213 of the mold 102 with the imprint material. The curing step can be performed when the controller 130 controls the curing unit 105 to irradiate the imprint material on the pattern formation region 203 and the non-pattern formation region 204 with the curing energy. The separation step is a step of separating the cured product (pattern) of the imprint material on the pattern formation region of the member 103 and the pattern region 213 of the mold 102 from each other. The separation step can be performed when the controller 130 operates the relative driving mechanism 150. The imprint material on the non-pattern formation region 204 may be cured after the separation step.

The failure detection processing can be executed by the controller 130 based on an image (a detection result detected by the image capturing device 109) captured by the image capturing device 109. The failure detection processing can include defect detection processing of detecting an unfilled defect and abnormality detection processing of detecting an abnormality in the dispenser 106. In this case, the image capturing device 109 can be configured to capture (detect) both the pattern formation region 203 and the non-pattern formation region 204. However, the failure detection processing may include only the processing of detecting an abnormality in the dispenser 106. In this case, the image capturing device 109 can be configured to capture only the non-pattern formation region 204 out of the pattern formation region 203 and the non-pattern formation region 204.

The defect detection processing of detecting an unfilled defect can be understood as processing of detecting an abnormality in processing of forming a pattern on the pattern formation region 203. The unfilled defect indicates unfilling of the pattern region 213 (the concave portion thereof) of the mold 102 with the imprint material, that is caused by, for example, a foreign substance adhered to the member 103 or the mold 102, chemical contamination of the member 103 or the mold 102, or entering of bubbles. An abnormality in the dispenser 106 that can be detected in the abnormality detection processing can be, for example, a state in which no imprint material is discharged from the nozzles of the dispenser 106 or a state in which an appropriate amount of the imprint material is not discharged from the nozzles of the dispenser 106.

If the surface of the member 103 has a lyophobic property, the imprint material placed or arranged on the pattern formation region 203 of the member 103 is maintained in a droplet-like shape, and it is thus easy to identify individual droplets of the imprint material. Therefore, if the surface of the member 103 has the lyophobic property, the pattern formation region 203 of the member 103 is captured by the image capturing device 109, and a captured image is processed, thereby detecting an abnormality in the dispenser 106.

However, to improve the filling property of the pattern region 213 (concave portion thereof) of the mold 102 with the imprint material, processing of giving a lyophilic property to the pattern formation region 203 of the member 103 can be performed. If the pattern formation region 203 has the lyophilic property, the imprint material supplied to the pattern formation region 203 spreads on the pattern formation region 203 to form a film of the imprint material together with the imprint material on the periphery, thereby disabling identification. Therefore, if the pattern formation region 203 of the member 103 has the lyophilic property, it is difficult to identify the imprint material placed or arranged on the pattern formation region 203 of the member 103.

Thus, if the pattern formation region 203 of the member 103 has the lyophilic property, it is difficult to detect an abnormality in the dispenser 106 by processing an image obtained by capturing, by the image capturing device 109, the pattern formation region 203 of the member 103.

To solve this problem, in the first embodiment, the dispenser 106 places or arranges the imprint material on the non-pattern formation region 204 of the member 103, and the image capturing device 109 captures the non-pattern formation region 204. Then, the controller 130 performs processing for determining an abnormality in the dispenser 106 based on the image of the non-pattern formation region 204 captured by the image capturing device 109. The processing for determining an abnormality in the dispenser 106 can include abnormality detection processing of detecting an abnormality in the dispenser 106 based on the image of the non-pattern formation region 204 captured by the image capturing device 109. The abnormality detection processing can include processing of detecting, among the plurality of nozzles of the dispenser 106, a nozzle that cannot discharge the imprint material. Alternatively, the abnormality detection processing can include processing of detecting, among the plurality of nozzles of the dispenser 106, a nozzle whose discharge amount of the imprint material is abnormal.

When the non-pattern formation region 204 has the lyophobic property, it is easier to detect an abnormality in the dispenser 106 in accordance with the presence/absence of the imprint material. However, the non-pattern formation region 204 may have the lyophilic property. The reason for this will be described below.

Since a gap between the pattern formation region 203 and the pattern region 213 facing it is small, the imprint material on the pattern formation region 203 has a relatively high vapor pressure and is difficult to evaporate. After the pattern region 213 of the mold 102 is brought into contact with the imprint material on the pattern formation region 203, the imprint material is not almost evaporated. On the other hand, since a gap between the non-pattern formation region 204 and the non-pattern region 214 facing it is large, the imprint material on the non-pattern formation region 204 has a relatively low vapor pressure, and is relatively easy to evaporate. Even after the pattern region 213 of the mold 102 is brought into contact with the imprint material on the pattern formation region 203, the imprint material on the non-pattern formation region 204 is exposed to a peripheral atmosphere (for example, a purge gas), and is relatively easily evaporated. Therefore, even if the pattern formation region 203 has the lyophilic property, and the imprint material forms a film immediately after the imprint material is supplied onto the pattern formation region 203, the imprint material is partially evaporated, and can thus decrease. This makes it possible to identify the presence/absence of the imprint material or an amount of the imprint material. A relative vapor pressure is a representation for comparing a vapor pressure in a space on the pattern formation region 203 with that in a space on the non-pattern formation region 204. Relative evaporation is a representation for comparing evaporation in the space on the pattern formation region 203 with that in the space on the non-pattern formation region 204.

Figure 2A:
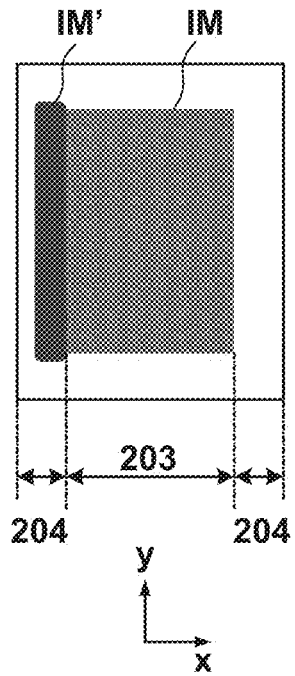
FIGS. 2A to 2F are views each schematically showing an image captured by an image capturing device when there is no abnormality in a dispenser.

FIGS. 2A to 2F schematically show transition of an image captured by the image capturing device 109 when there is no abnormality in the dispenser 106. The image capturing device 109 captures the pattern formation region 203 and the non-pattern formation region 204. FIG. 2A schematically shows a state immediately after the dispenser 106 places or arranges imprint materials IM and IM' on the pattern formation region 203 and the non-pattern formation region 204 of the member 103 and the pattern formation region 203 is positioned under the mold 102.

The dispenser 106 can be controlled to place or arrange the imprint material IM on the pattern formation region 203 of the member 103 in accordance with a first map MP1, and place or arrange the imprint material IM' on the non-pattern formation region 204 in accordance with a second map MP2 different from the first map MP1. For example, the second map MP2 can be created so as to discharge the imprint material IM' from all the nozzles of the dispenser 106. The second map MP2 can be created so as to individually identify droplets of the imprint material IM' applied to the non-pattern formation region 204 by the dispenser 106.

The dispenser 106 can be controlled in accordance with the second map MP2 so as to place or arrange the imprint material IM' on the non-pattern formation region 204 using all the plurality of nozzles for arranging the imprint material IM on the pattern formation region 203 in accordance with the first map MP1. This makes it possible to grasp occurrence of a failure in processing of arranging the imprint material IM on the pattern formation region 203.

Figure 2C:
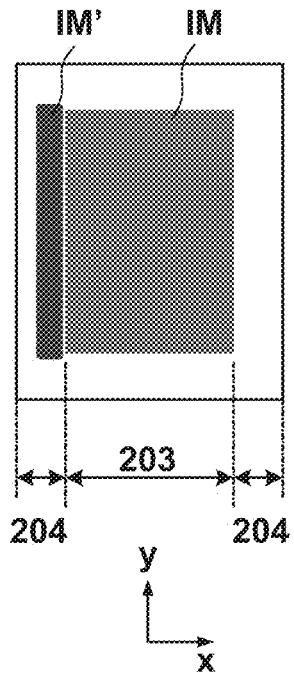
Figure 2E:
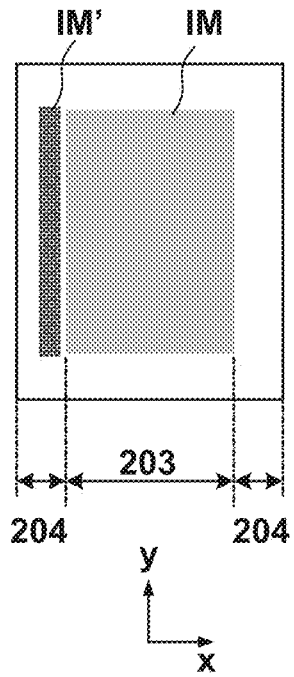
Figure 2B:
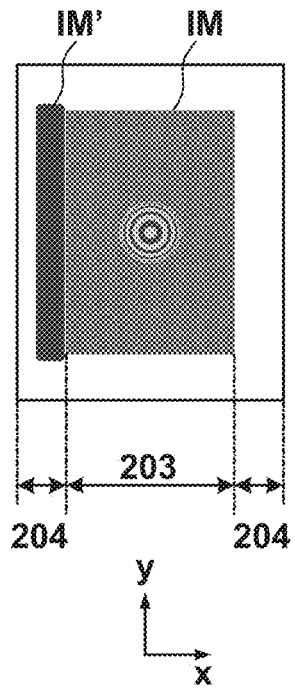

FIG. 2B schematically shows a state in which the member 103 and the mold 102 are deformed into convex shapes using the deformation mechanisms, and the imprint material IM on the pattern formation region 203 and the central portion of the pattern region 213 are brought into contact with each other using the relative driving mechanism 150. Interference fringes (Newton rings) appear at the center of the image. FIG. 2C schematically shows a state in which the imprint material IM on the pattern formation region 203 of the member 103 and the entire pattern region 213 of the mold 102 are in contact with each other. While relaxing the deformation of the member 103 and that of the mold 102 by the deformation mechanisms, the relative driving mechanism 150 can decrease the distance between the member 103 and the mold 102. This can bring the imprint material IM on the pattern formation region 203 and the entire pattern region 213 into contact with each other. In the state shown in FIG. 2C, bubbles called microbubbles can exist in the imprint material IM on the pattern formation region 203.

Figure 2D:
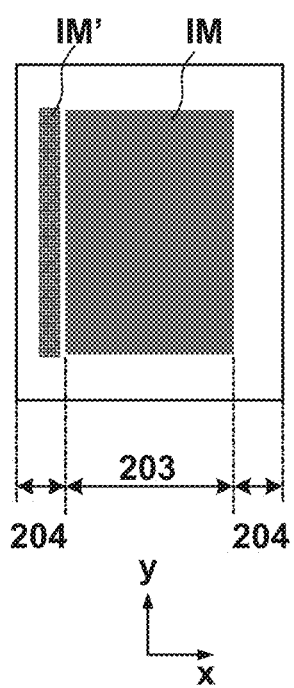
Figure 2F:
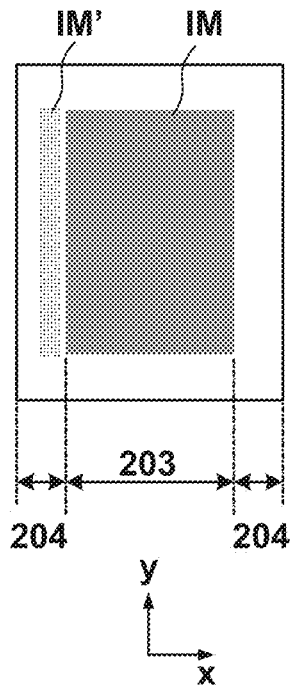

FIG. 2D schematically shows a state immediately before the imprint material is cured after filling of the concave portion of the pattern region 213 of the mold 102 with the imprint material IM is completed. FIG. 2E schematically shows a state in which the imprint material is irradiated with curing energy (in this example, light such as ultraviolet light) to cure the imprint material IM. FIG. 2F schematically shows a state in which the cured product of the imprint material IM and the pattern region 213 of the mold 102 are separated from each other by increasing the distance between the member 103 and the mold 102 using the relative driving mechanism 150.

In the example shown in FIGS. 2A to 2F, in the states shown in FIGS. 2A to 2C, the imprint material IM' on the non-pattern formation region 204 is not observed as isolated droplets. This is because the imprint material IM' forms a continuous film on the non-pattern formation region 204. However, the imprint material IM' on the non-pattern formation region 204 is changed into separated droplets when the imprint material IM' is gradually evaporated to decrease in volume, and the droplets can be identified in the state shown in FIG. 2D. Furthermore, in the states shown in FIGS. 2E and 2F, the droplets can be identified more clearly.

Figure 3A:
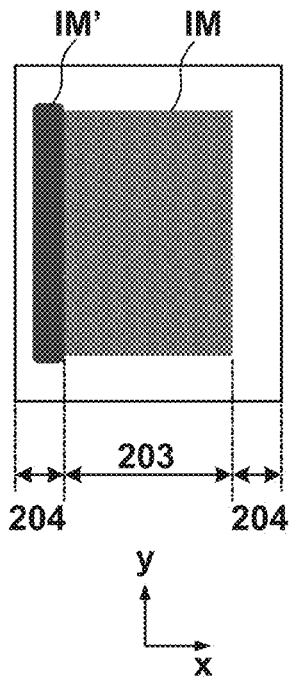
FIGS. 3A to 3F are views each schematically showing an image captured by the image capturing device when there is an abnormality in the dispenser.

FIGS. 3A to 3F schematically show transition of an image captured by the image capturing device 109 when there is an abnormality (a nozzle that cannot discharge the imprint material) in the dispenser 106. FIGS. 3A to 3F show images captured at timings corresponding to FIGS. 2A to 2F, respectively. FIG. 3A schematically shows a state immediately after the dispenser 106 places or arranges the imprint materials IM and IM' on the pattern formation region 203 and the non-pattern formation region 204 of the member 103 and the pattern formation region 203 is positioned under the mold 102.

Figure 3C:
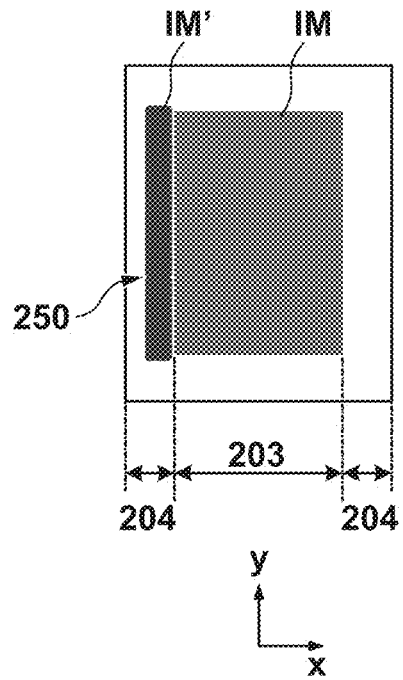
Figure 3E:
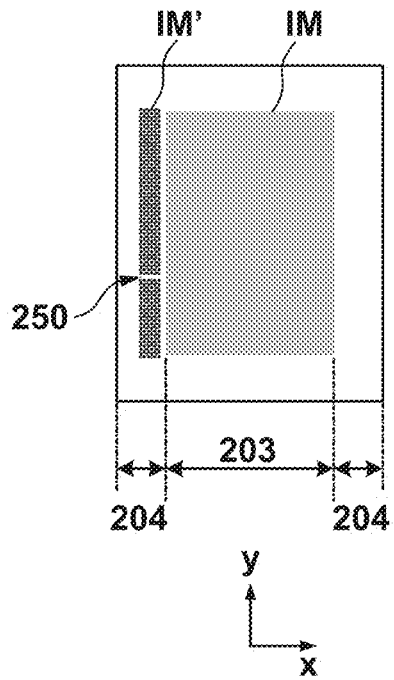
Figure 3B:
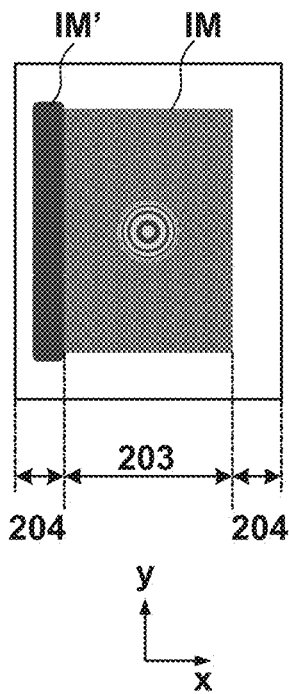

FIG. 3B schematically shows a state in which the member 103 and the mold 102 are deformed into convex shapes using the deformation mechanisms, and the imprint material IM on the pattern formation region 203 and the central portion of the pattern region 213 are brought into contact with each other using the relative driving mechanism 150. Interference fringes (Newton rings) appear at the center of the image. FIG. 3C schematically shows a state in which the imprint material IM on the pattern formation region 203 of the member 103 and the entire pattern region 213 of the mold 102 are in contact with each other. In the state shown in FIG. 3C, a discharge abnormality 250 caused by the existence of the abnormality (the nozzle that cannot discharge the imprint material) in the dispenser 106 slightly appears.

Figure 3D:
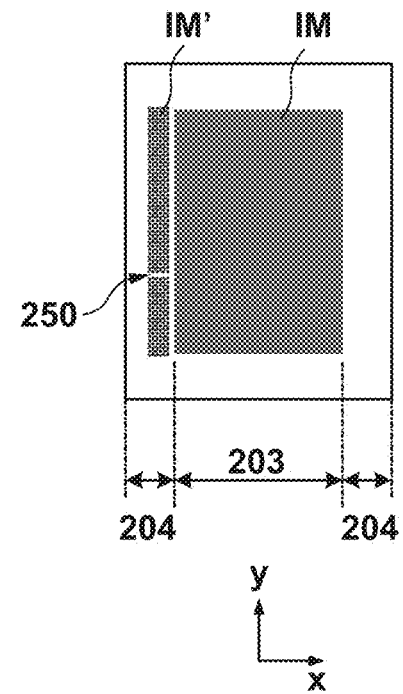
Figure 3F:
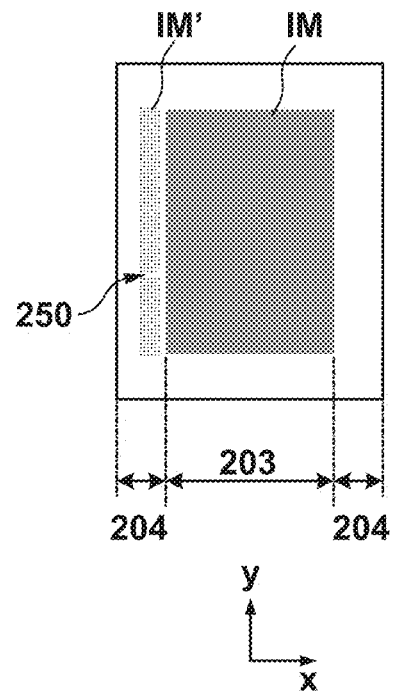

FIG. 3D schematically shows a state immediately before the imprint material is cured after filling of the concave portion of the pattern region 213 of the mold 102 with the imprint material IM is completed. In the state shown in FIG. 3D, the discharge abnormality 250 caused by the existence of the abnormality (the nozzle that cannot discharge the imprint material) in the dispenser 106 appears clearly. FIG. 3E schematically shows a state in which the imprint material is irradiated with curing energy (in this example, light such as ultraviolet light) to cure the imprint material IM. In the state shown in FIG. 3E as well, the discharge abnormality 250 caused by the existence of the abnormality (the nozzle that cannot discharge the imprint material) in the dispenser 106 appears clearly. FIG. 3F schematically shows a state in which the cured product of the imprint material IM and the pattern region 213 of the mold 102 are separated from each other by increasing the distance between the member 103 and the mold 102 using the relative driving mechanism 150. In the state shown in FIG. 3F, the discharge abnormality 250 caused by the existence of the abnormality (the nozzle that cannot discharge the imprint material) in the dispenser 106 appears.

In consideration of the above description, the controller 130 can execute the abnormality detection processing based on the image of the non-pattern formation region 204 captured by the image capturing device 109 in the state in which the entire pattern region 213 is in contact with the imprint material IM on the pattern formation region 203. Alternatively, the controller 130 can execute the abnormality detection processing based on the image of the non-pattern formation region 204 captured by the image capturing device 109 before the imprint material IM is cured after the entire pattern region 213 is brought into contact with the imprint material IM. Alternatively, the controller 130 can execute the abnormality detection processing based on the image of the non-pattern formation region 204 captured by the image capturing device 109 during a period in which the imprint material IM on the pattern formation region 203 is cured.

The controller 130 can execute the abnormality detection processing based on the image of the non-pattern formation region 204 captured by the image capturing device 109 during a period in which driving is performed to separate the pattern region 213 and the cured imprint material IM on the pattern formation region 203 from each other. Alternatively, the controller 130 can execute the abnormality detection processing based on the image of the non-pattern formation region 204 captured by the image capturing device 109 before the relative positions of the member 103 and the mold 102 are changed with respect to the X and Y directions (in other words, directions parallel to the pattern formation region 203) after the cured imprint material IM and the pattern region 213 are separated from each other.

Figure 4A:
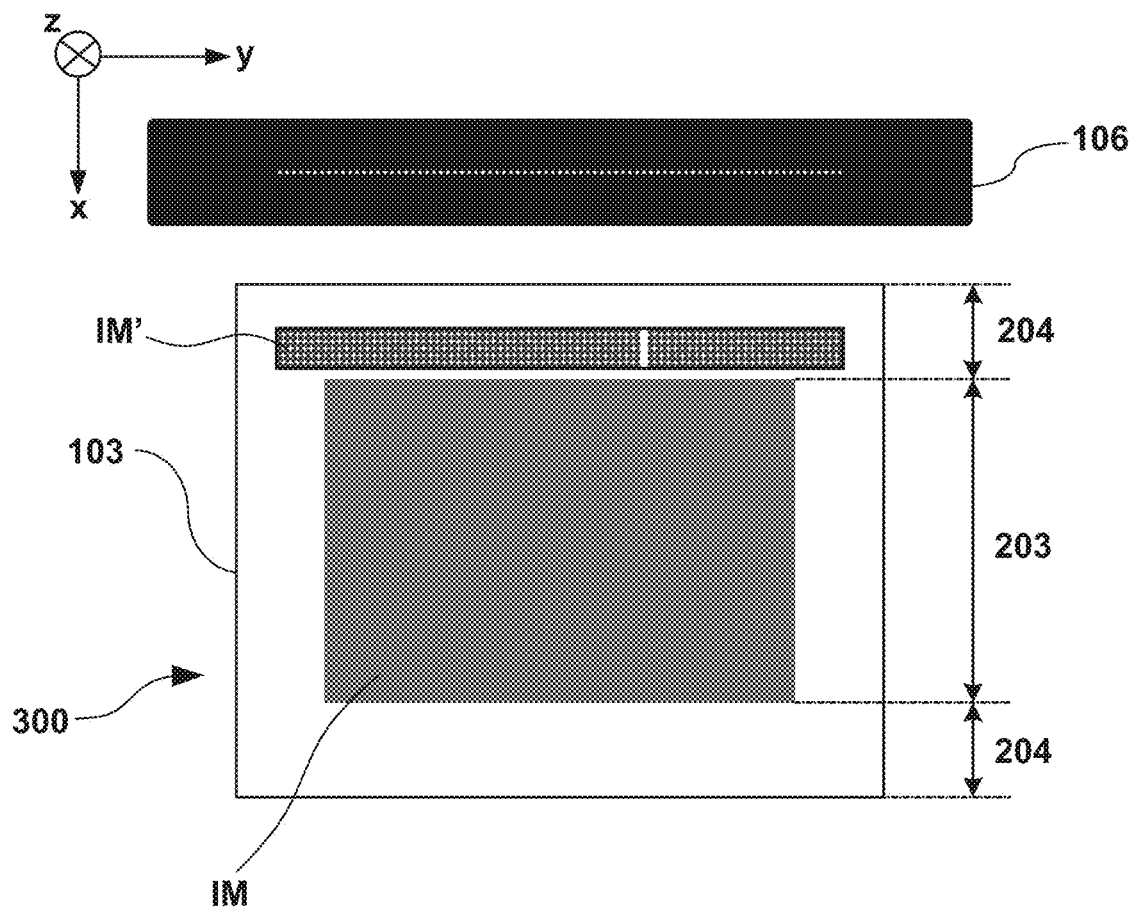
FIG. 4A is a view showing an image captured by the image capturing device when there is an abnormality in the dispenser.
Figure 4B:
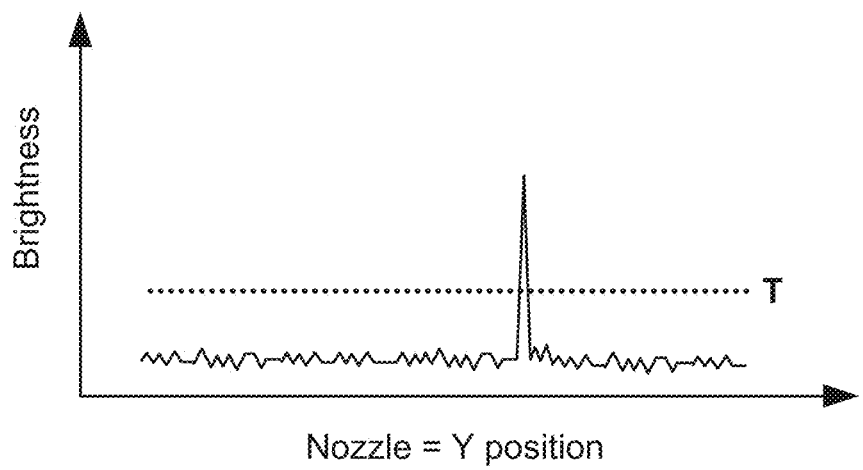
FIG. 4B is a graph schematically showing a result of processing the image shown in FIG. 4A.

As exemplified in FIG. 4A, the plurality of nozzles (portions represented by open circles) of the dispenser 106 can be arrayed in the Y direction. The controller 130 obtains a result exemplified in FIG. 4B by integrating brightness in the image of the non-pattern formation region 204 in an image 300 captured by the image capturing device 109 with respect to the X direction. The X direction indicates the scanning direction of the member 103 when the dispenser 106 places or arranges the imprint material. In FIG. 4B, the abscissa represents a position in the Y direction, and the ordinate represents an integrated value obtained by integrating the brightness in the image of the non-pattern formation region 204 with respect to the X direction. By comparing the integrated value with a threshold Ta, the controller 130 can specify a position (a position in the Y direction) at which no imprint material IM' is placed or arranged, that is, a nozzle that cannot discharge the imprint material.

According to the first embodiment, the imprint material IM' is placed or arranged on the non-pattern formation region 204 outside the pattern formation region 203, and an abnormality in the dispenser 106 is detected based on the image of the non-pattern formation region 204. Therefore, according to the first embodiment, it is possible to detect an abnormality in the dispenser 106 with a load (the calculation load of image processing and the like) smaller than that in a method of detecting an abnormality in the dispenser 106 based on an image of the entire pattern formation region 203. Furthermore, according to the first embodiment, it is possible to execute the abnormality detection processing in parallel to the imprint process, and thus suppress a decrease in throughput caused by execution of the abnormality detection processing.

Figure 5:
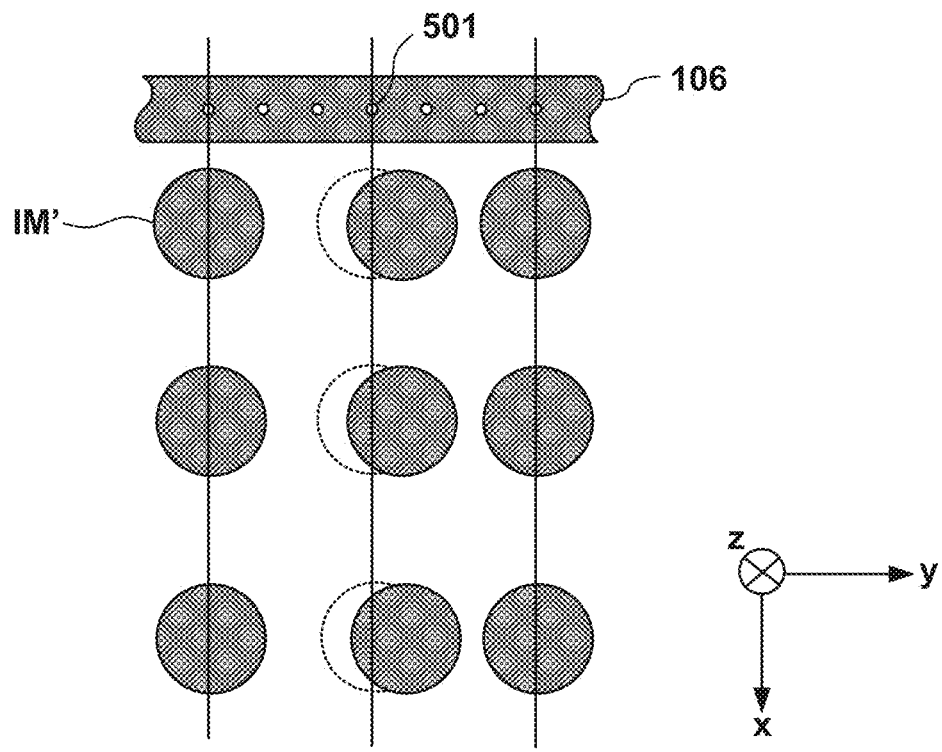
FIG. 5 is a view schematically showing an image captured by the image capturing device.

By adopting an image capturing device with a high resolution as the image capturing device 109, it is possible to individually identify a plurality of droplets of the imprint material IM'. This can individually evaluate the characteristics of the nozzles of the dispenser 106. In an example shown in FIG. 5, a nozzle 501 of the dispenser 106 can discharge the imprint material IM' but unwantedly places or arranges the imprint material IM' at a position deviated from a target position. Referring to FIG. 5, a dotted line indicates a target position. The controller 130 can specify the nozzle 501 based on an image captured by the image capturing device 109.

Figure 6:
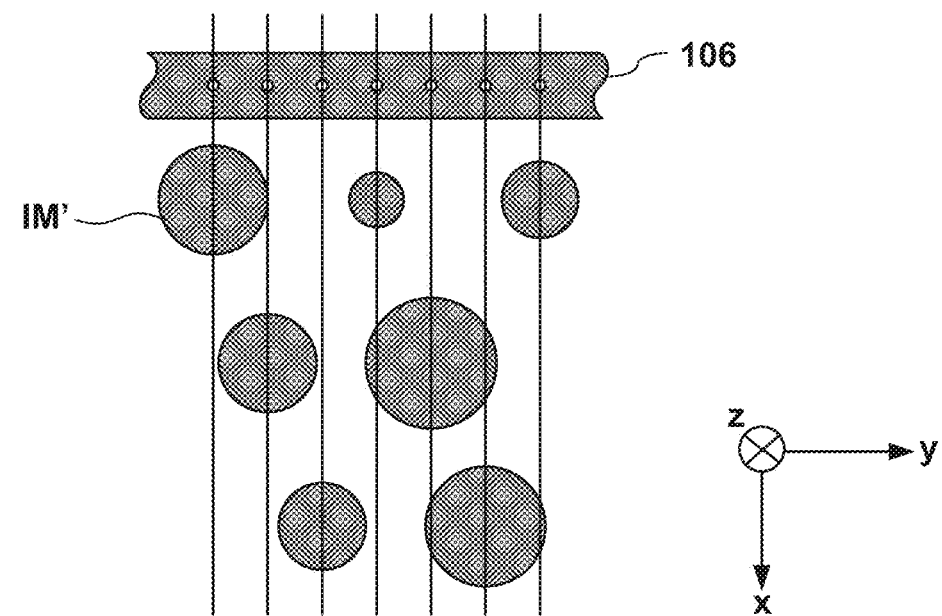
FIG. 6 is a view exemplifying an imprint material placed in accordance with the second map.

As exemplified in FIG. 6, the second map MP2 can be used, in which the imprint material IM' is placed or arranged so that even if droplets of the imprint material IM' supplied by the dispenser 106 to the non-pattern formation region 204 of the member 103 spread, the individual droplets of the imprint material IM' are placed or arranged to be identifiable. In this case, it is not necessary to wait until the individual droplets of the imprint material IM' become identifiable due to evaporation of the imprint material IM'. That is, it is possible to execute the abnormality detection processing of detecting the abnormality in the dispenser 106 immediately after the dispenser 106 supplies the imprint material to the non-pattern formation region 204 of the member 103.

Figure 7A:
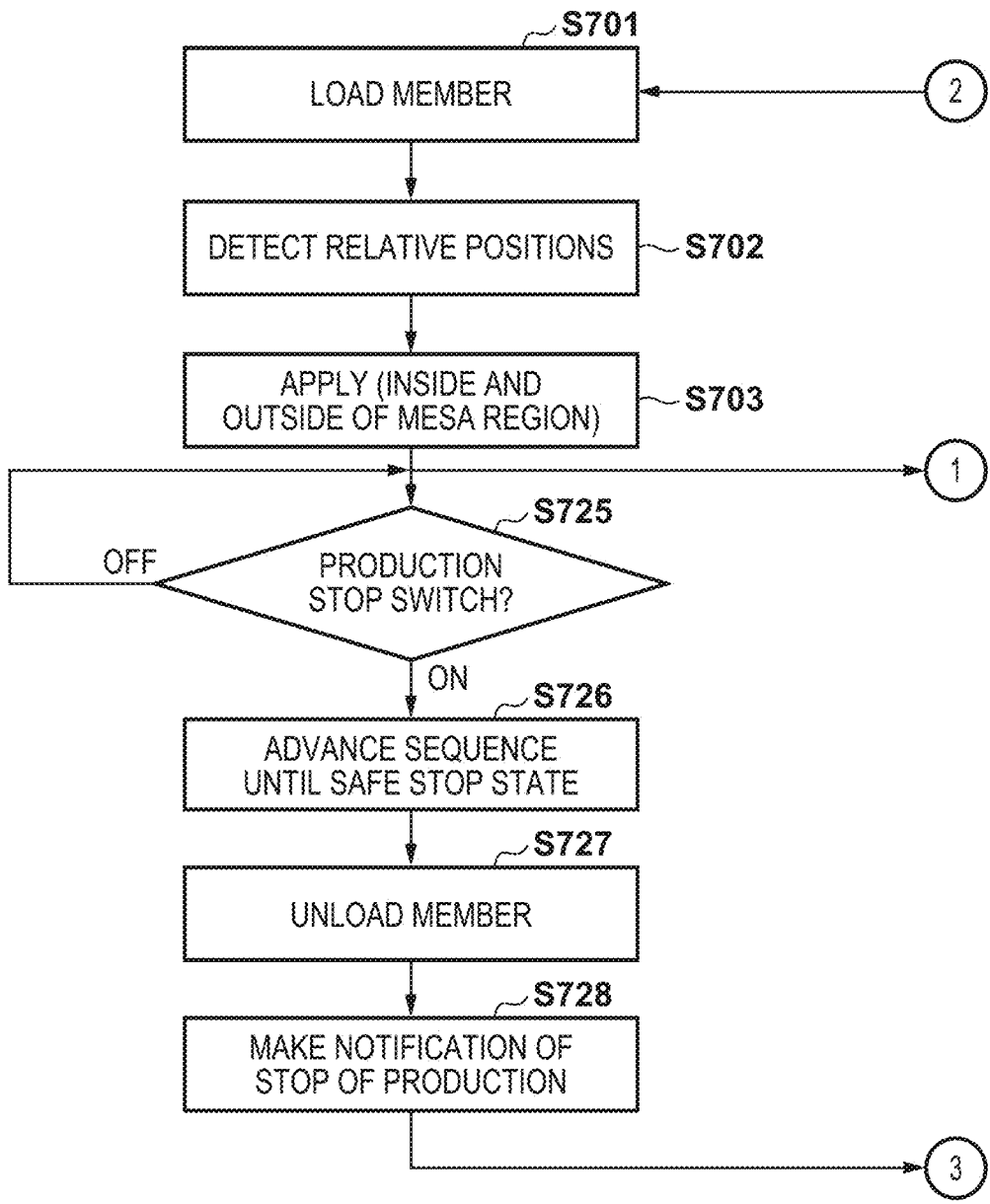
FIGS. 7A to 7B are flowcharts exemplifying the operation of the imprint apparatus according to the first embodiment.
Figure 7B:
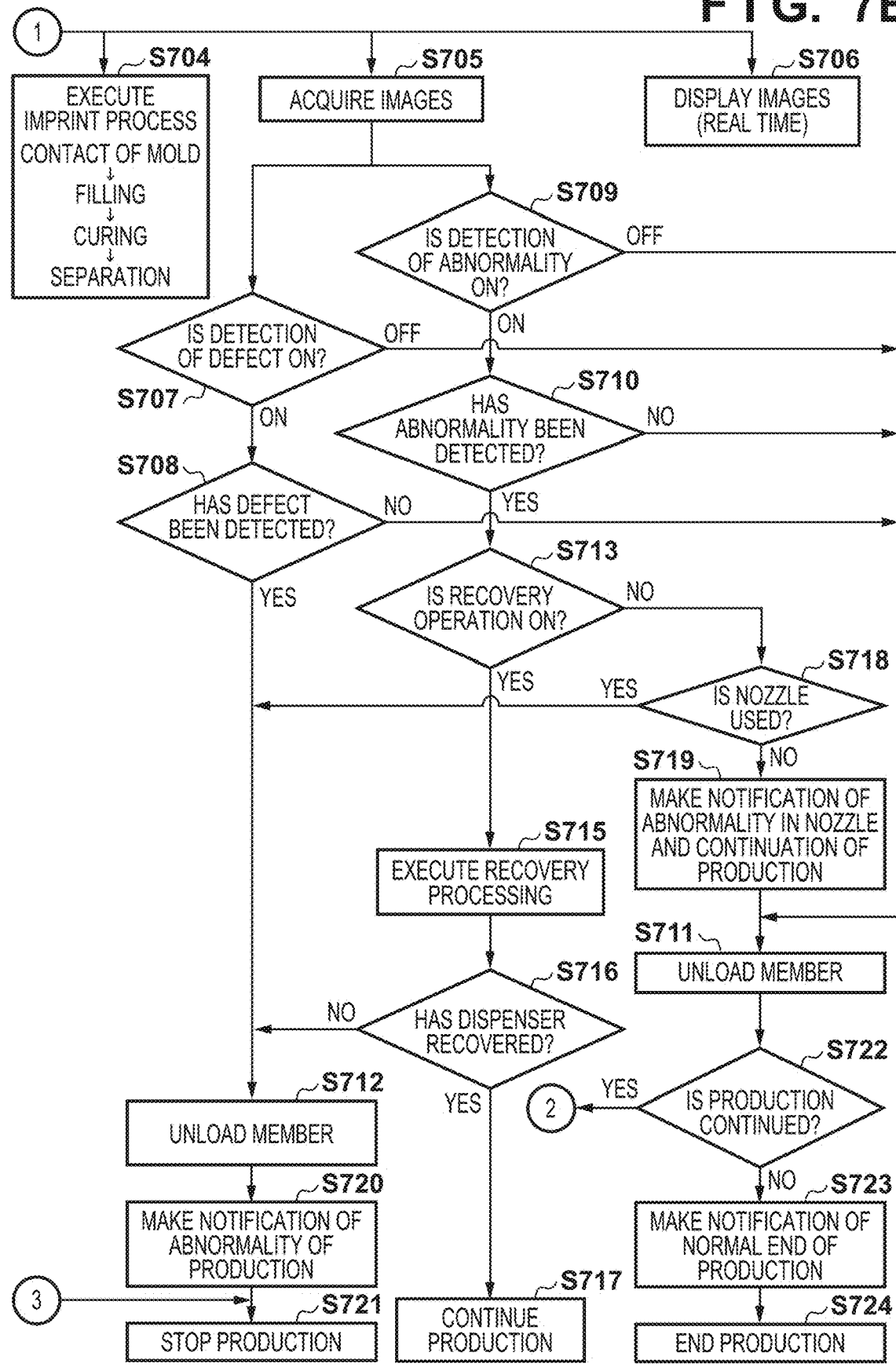

FIGS. 7A and 7B show an example of the operation of the imprint apparatus 100 according to the first embodiment. This operation is controlled by the controller 130. In step S701, the member 103 is conveyed onto the chuck 114 of the stage 104, and held by the chuck 114. In step S702, the relative positions of the member 103 and the mold 102 are detected. In step S703, the dispenser 106 places or arranges the imprint material on the pattern formation region 203 and the non-pattern formation region of the member 103.

In step S704, an imprint process is executed. As described above, the imprint process can include a contact step, a filling step, a curing step, and a separation step. Steps S705 and S706 can be executed in parallel to step S704. In step S705, the image capturing device 109 captures the pattern formation region 203 and the non-pattern formation region 204. In step S706, the images captured in step S705 or images obtained by processing the captured images are displayed on a display (not shown).

After step S705, steps S707 to S710 can be executed in parallel to step S704. The controller 130 has a function of setting whether to execute defect detection processing. In step S707, the controller 130 determines whether execution of the defect detection processing has been set. If execution of the defect detection processing has been set, the process advances to step S708; otherwise, the process advances to step S711. In step S708, the controller 130 executes processing of detecting an unfilled defect based on the image of the pattern formation region 203. If an unfilled defect has been detected, the process advances to step S712; otherwise, the process advances to step S711.

The controller 130 has a function of setting whether to execute abnormality detection processing. In step S709, it is determined whether execution of the abnormality detection processing of detecting an abnormality in the dispenser 106 has been set. If execution of the abnormality detection processing has been set, the process advances to step S710; otherwise, the process advances to step S711. In step S710, the controller 130 executes the abnormality detection processing of detecting an abnormality in the dispenser 106 based on the image of the non-pattern formation region 204. If an abnormality in the dispenser 106 has been detected, the process advances to step S713; otherwise, the process advances to step S711. Note that step S711 is executed after the end of step S704 parallelly executed.

The controller 130 has a function of setting whether to execute recovery processing of recovering an abnormal nozzle of the dispenser 106. In step S713, the controller 130 determines whether execution of the recovery processing has been set. If execution of the recovery processing has been set, the process advances to step S715; otherwise, the process advances to step S718. In step S715, the recovery processing is executed. The recovery processing can include, for example, an operation of sucking the lower surface (a surface on which the orifices of the nozzles are arranged) of the dispenser 106 by a suction mechanism (not shown) in order to recover from an abnormality caused by an overflow of the imprint material onto the lower surface. Alternatively, the recovery processing can include an operation of pushing out the imprint material by applying a positive pressure from the inside of the dispenser 106 to the nozzles in order to recover from an abnormality caused by clogging of the nozzles.

In step S716, the controller 130 determines whether the dispenser 106 has recovered from an abnormal state. This determination processing can be performed by, for example, observing the nozzles by a camera (not shown) or observing discharge by a discharge observation apparatus (not shown). If it is determined in step S716 that the dispenser 106 has recovered from the abnormal state, the process advances to step S717 to continue production; otherwise, the process advances to step S712. In step S712, the member 103 is unloaded. In step S720, a notification of occurrence of an abnormality is made. In step S721, production is stopped.

In step S718, the controller 130 determines, based on the first map MP1, whether an abnormal nozzle is used to place or arrange the imprint material on the pattern formation region 203. If the abnormal nozzle is used to place or arrange the imprint material on the pattern formation region 203, the process advances to step S712; otherwise, the process advances to step S719. The latter case indicates that there is no problem to form a pattern on the pattern formation region 203 although the abnormal nozzle exists. In step S719, the controller 130 makes a notification of the existence of an abnormality in the nozzle of the dispenser 106 and continuation of production.

The member 103 is unloaded in step S711, and it is determined in step S722 whether to continue production. If production is continued, the process returns to step S701. If production is to end, a notification that production normally ends is made in step S723, and production ends in step S724.

As the processing for determining an abnormality in the dispenser 106, the imprint apparatus 100 can execute, in step S706, processing of displaying the images for determination on the display and prompting an operator to determine the presence/absence of an abnormality in the dispenser 106. The imprint apparatus 100 can include a production stop switch for stopping production in accordance with determination by the operator. In step S725, the controller 130 determines whether the production stop switch has been turned on (that is, a production stop instruction has been issued). If the switch has been turned on, the process advances to step S726. In step S726, the controller 130 advances the sequence until a safe stop state. If, for example, the imprint material on the pattern formation region 203 is not cured, the controller 130 cures the imprint material so that the member 103 is unloaded after the cured imprint material and the mold 102 are separated from each other. In step S727, the member 103 is unloaded. In step S728, a notification that production is to be stopped is made. In step S721, production is stopped.

Figure 8:
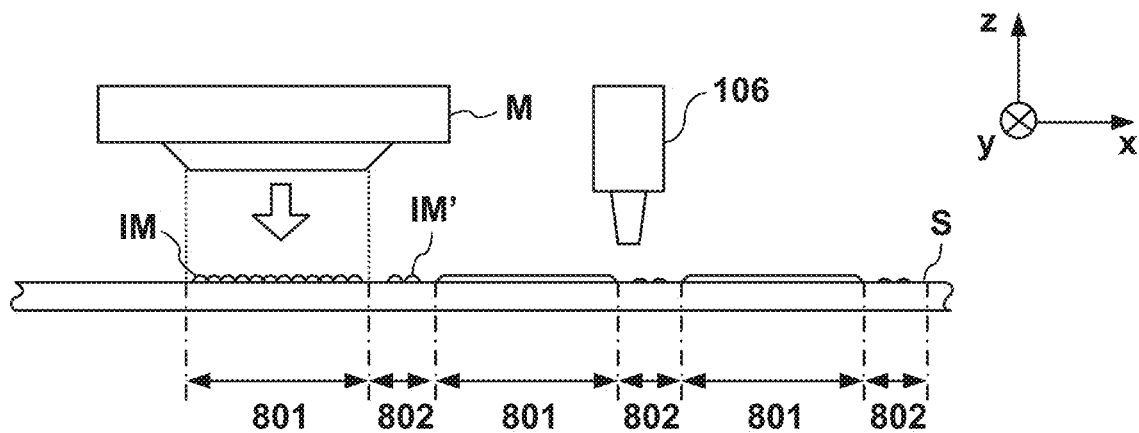
FIG. 8 is a view showing part of the arrangement of an imprint apparatus according to the second embodiment.
Figure 9:
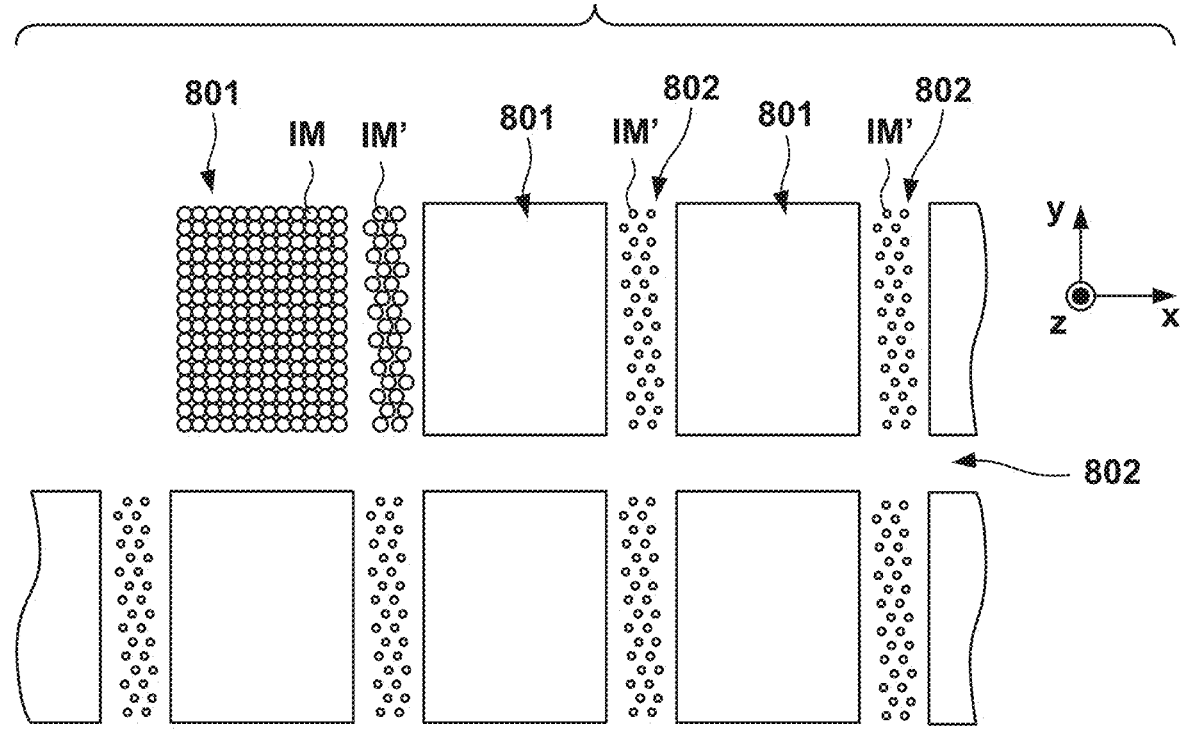
FIG. 9 is a view for explaining the operation of the imprint apparatus according to the second embodiment.

An imprint apparatus according to the second embodiment of the present invention will be described below with reference to FIGS. 8 and 9. Note that matters not mentioned in the second embodiment can comply with the first embodiment. An imprint apparatus according to the second embodiment is configured to transfer a pattern of a mold M to a member S such as a semiconductor substrate as a pattern formation target member. Although not shown in FIG. 8, the imprint apparatus according to the second embodiment can have the same arrangement as that of the imprint apparatus 100 according to the first embodiment.

The mold M can be a replica mold formed when, for example, the imprint apparatus 100 according to the first embodiment transfers a pattern of a master mold as a mold 102 to a blank mold as a member 103. The member S includes a plurality of pattern formation regions 801 (shot regions). In the second embodiment, non-pattern formation regions 802 can be scribe line regions between the plurality of pattern formation regions 801.

In the second embodiment, a dispenser 106 places or arranges imprint materials IM and IM' on the pattern formation regions 801 and the non-pattern formation regions 802 outside the pattern formation regions 801 out of the surface of the member S. An image capturing device 109 captures each non-pattern formation region 802 in a state in which the dispenser 106 places or arranges the imprint material IM' on the non-pattern formation region 802. A controller 130 performs processing for determining an abnormality in the dispenser 106 based on the image of the non-pattern formation region 802 captured by the image capturing device 109.

An imprint apparatus according to the third embodiment will be described next. Note that matters not mentioned in the third embodiment can comply with the first or second embodiment. In this embodiment, on-axis alignment scopes 111 that detect marks of a member 103, a mold 102, and a reference plate 112 detect an imprint material discharged by a dispenser 106. Each on-axis alignment scope 111 emits illumination light obliquely with respect to an optical axis, illuminates an object such as the mold 102 or the member 103, and detects, by a light-receiving element, light reflected by the object in the direction of the optical axis. As described above, each on-axis alignment scope 111 (detecting device) measures the object by dark field illumination (dark field observation).

The operation of the imprint apparatus according to the third embodiment will be exemplarily described below. The operation to be described below can be controlled by a controller 130. Based on the general relative positions of the member 103 and the mold 102, a member driving mechanism 120 positions the member 103 so that an alignment mark 34 of the member 103 enters the fields of view of the on-axis alignment scopes 111. The imprint apparatus is provided with four on-axis alignment scopes 111.

Figure 11:
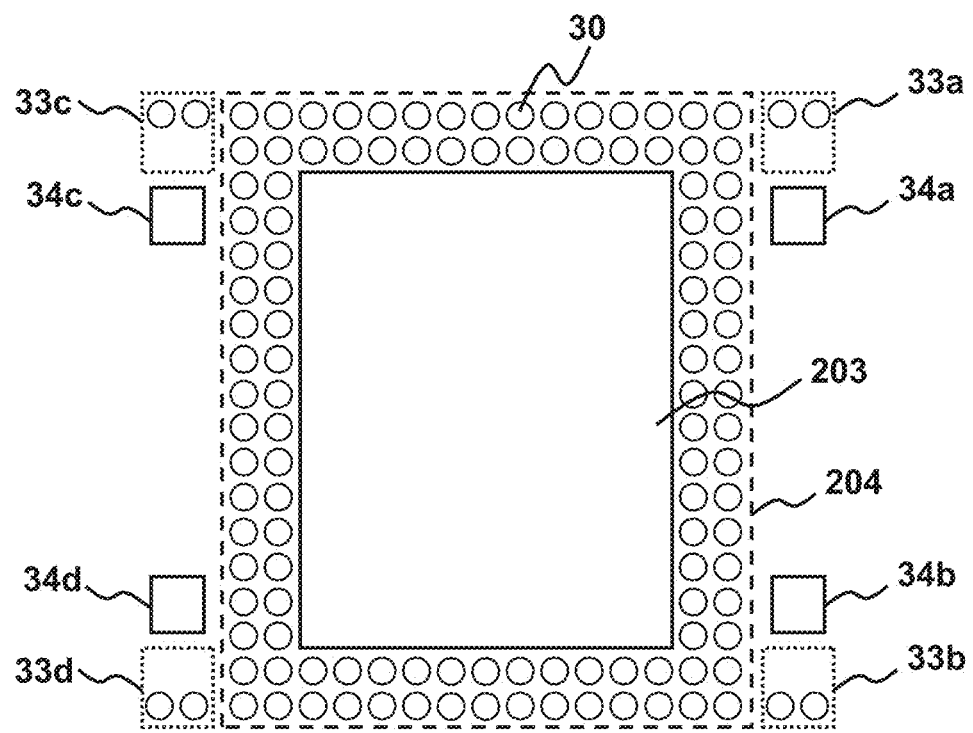
FIG. 11 is a view exemplifying a portion close to a pattern formation region of a member.

FIG. 11 is a plan view exemplifying a pattern formation region 203 of the member 103 and a portion close to it (a portion around it). As shown in FIG. 11, alignment marks 34 (34a, 34b, 34c, and 34d) are respectively provided at four corners outside the pattern formation region 203 of the member 103. The mold 102 is also provided with alignment marks at positions corresponding to the alignment marks 34. One on-axis alignment scope 111 is configured to detect one alignment mark 34.

Next, the on-axis alignment scopes 111 are used to detect the relative positions of the alignment marks 34 of the member 103 and the alignment marks of the mold 102. Based on the relative positions, the pattern formation region 203 of the member 103 and the pattern region 213 of the mold 102 can be aligned.

The member driving mechanism 120 moves the member 103 to be positioned under the dispenser 106. Then, the dispenser 106 places or arranges an imprint material 30 on the member 103. For example, the dispenser 106 places or arranges the imprint material by discharging the imprint material in a state in which the member driving mechanism 120 continuously scans the member 103 in a predetermined direction. In this embodiment, the imprint material 30 is placed or arranged on third regions 33 (33a, 33b, 33c, and 33d) outside a non-pattern formation region 204 in addition to the pattern formation region 203 and the non-pattern formation region 204 on which the imprint material is placed or arranged in the first embodiment. As shown in FIG. 11, the third regions 33 are located at four corners outside the pattern formation region 203, and include the third regions 33a, 33b, 33c, and 33d provided adjacent to the alignment marks 34. Similarly to the non-pattern formation region 204, each third region 33 is a region where no pattern is formed and which is smaller than a field of view detectable by each on-axis alignment scope 111. The controller 130 acquires the first data (map) indicating a position, at which the imprint material is to be placed or arranged, in a region including the pattern formation region 203 and the non-pattern formation region 204. The controller 130 creates the third data by adding, to the first data, the second data indicating a position in each third region 33, at which the imprint material is to be placed or arranged. The controller 130 controls discharge of the dispenser 106 so that the imprint material is placed or arranged based on the third data.

As shown in FIG. 11, the imprint material is placed or arranged on the third regions 33a and 33c so as to form the same arrangement as that of the imprint material arrayed in the uppermost line of the non-pattern formation region 204. The imprint material is placed or arranged in the third regions 33b and 33d so as to form the same arrangement as that of the imprint material arrayed in the lowermost line of the non-pattern formation region 204. If there are two arrays of orifices of the dispenser 106, a setting can be made so that the arrays of orifices for discharging the imprint material to the uppermost line and the lowermost line of the non-pattern formation region 204 are different. In this case, it is possible to detect a discharge abnormality of the first array of orifices of the dispenser 106 by inspecting the third regions 33b and 33d, and detect a discharge abnormality of the second array of orifices of the dispenser 106 by inspecting the third regions 33a and 33c. Note that FIG. 11 does not illustrate the imprint material placed or arranged on the pattern formation region 203.

The member driving mechanism 120 is controlled so that the pattern formation region 203 of the member 103 and the pattern region 213 of the mold 102 are aligned based on data used when alignment is precedingly performed. Each on-axis alignment scope 111 is configured to be movable, and includes a driving unit that moves the on-axis alignment scope 111. Before the pattern formation region 203 of the member 103 and the pattern region 213 of the mold 102 are aligned, each on-axis alignment scope 111 is moved so that its field of view enters the third region 33 from a position when the alignment mark 34 is detected.

Each on-axis alignment scope 111 captures the third region 33 of the member 103, thereby observing the state of the imprint material placed or arranged on the third region 33. Since each on-axis alignment scope 111 performs dark field illumination, an image sensor detects light emitted by the on-axis alignment scope 111 and reflected and scattered by the imprint material. The controller 130 determines, based on the detected light, whether the imprint material is normally placed or arranged, that is, a discharge abnormality in the dispenser. For example, a total light amount detected by the on-axis alignment scopes 111 when there is no abnormality in the dispenser 106 and the imprint material is normally placed or arranged on the third region 33 is set as a reference value. Then, abnormality determination can be performed by comparing a total light amount actually detected by the on-axis alignment scopes 111 with the reference value. Alternatively, by setting, as a reference image, an image captured by each on-axis alignment scope 111 when there is no abnormality in the dispenser 106 and the imprint material is normally placed or arranged on the third region 33, and comparing an image with the reference image, a discharge abnormality may be determined.

Image capturing of the non-pattern formation region 204 by the image capturing device 109 can be performed parallelly. The controller 130 can perform processing for determining an abnormality in the dispenser 106 based on the images of the non-pattern formation region 204 and the third regions 33 captured by the image capturing device 109. Since the image capturing device 109 performs measurement (bright field observation) by bright field illumination, measurement can be performed by a method different from dark field observation by each on-axis alignment scope 111, thereby obtaining different measurement results. Therefore, it is possible to comprehensively determine an abnormality in the dispenser 106 by parallelly executing bright field observation by the image capturing device 109 and dark field observation by each on-axis alignment scope 111.

The above-described alignment scopes can detect an abnormality of the imprint material in detection fields before the mold 102 and the imprint material placed or arranged on the pattern formation region 203 of the member 103 are brought into contact with each other. If an abnormality is detected, the imprint material is exposed to curing light without bringing the mold 102 and the imprint material into contact with each other, and then the member 103 is unloaded. The reason why exposure is performed before unloading the member is that the imprint material is not cured, and is evaporated or scatters at the time of unloading the member, thereby contaminating the apparatus.

A field for selecting whether to execute image capturing of the non-pattern formation region 204 by the image capturing device 109 may be provided in the user interface of the imprint apparatus, and image capturing may be executed only when execution is selected. A field for selecting whether to execute arrangement of the imprint material on the third regions 33 by the dispenser 106 and image capturing of the third regions 33 by the on-axis alignment scopes 111 may be provided in the user interface, and arrangement and image capturing may be executed only when execution is selected.

A pattern of a cured product formed using the imprint apparatus is used permanently for at least some of various articles or used temporarily to manufacture various articles. The articles include an electric circuit element, an optical element, a MEMS, a recording element, a sensor, and a mold manufactured in the first embodiment. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of the cured product is used intact as a constituent member of some of the above-described articles or used temporarily as a resist mask. The resist mask is removed after etching, ion implantation, or the like is performed in a processing step of the substrate.

Figure 10A:
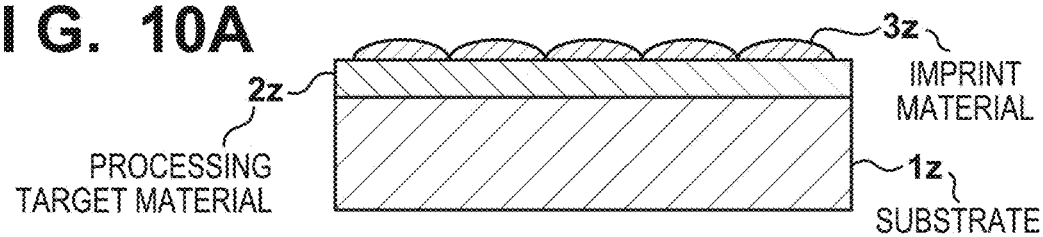
FIGS. 10A to 10F are views for explaining an article manufacturing method.

An article manufacturing method will be described next. As shown in FIG. 10A, a substrate $1z$ such as a silicon wafer having a processing target material $2z$ such as an insulator formed on its surface is prepared, and then an imprint material $3z$ is applied onto the surface of the processing target material $2z$ by an inkjet method or the like. A state in which the imprint material $3z$ formed into a plurality of droplets is applied onto the substrate is shown here.

Figure 10B:
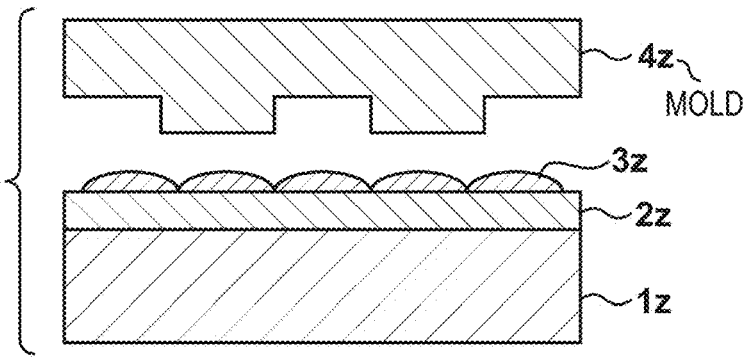
Figure 10C:
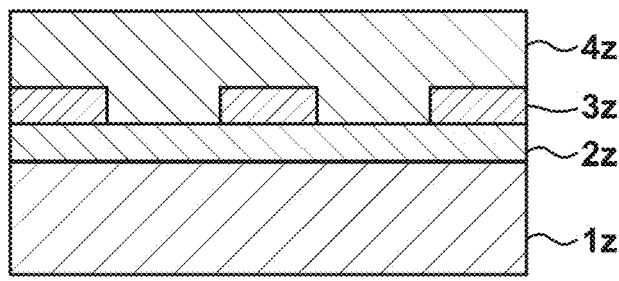

As shown in FIG. 10B, a side of an imprinting mold $4z$ on which its three-dimensional pattern is formed faces the imprint material $3z$ on the substrate. As shown in FIG. 10C, the mold $4z$ and the substrate $1z$ to which the imprint material $3z$ is applied are brought into contact with each other, and a pressure is applied. A gap between the mold $4z$ and the processing target material $2z$ is filled with the imprint material $3z$. When the imprint material $3z$ is irradiated with light as curing energy through the mold $4z$ in this state, the imprint material $3z$ is cured.

Figure 10D:
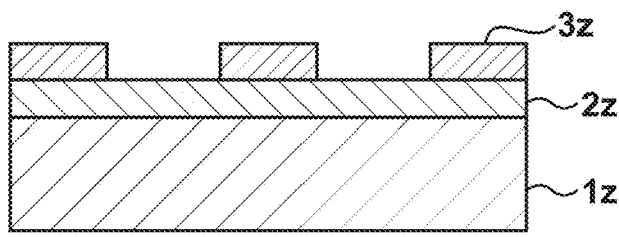

As shown in of FIG. 10D, the pattern of the cured product of the imprint material $3z$ is formed on the substrate $1z$ by separating the mold $4z$ and the substrate $1z$ from each other after curing the imprint material $3z$. The pattern of this cured product has a shape such that the concave portion of the mold corresponds to the convex portion of the cured product, and the convex portion of the mold corresponds to the concave portion of the cured product. That is, the three-dimensional pattern of the mold $4z$ is transferred to the imprint material $3z$.

Figure 10E:
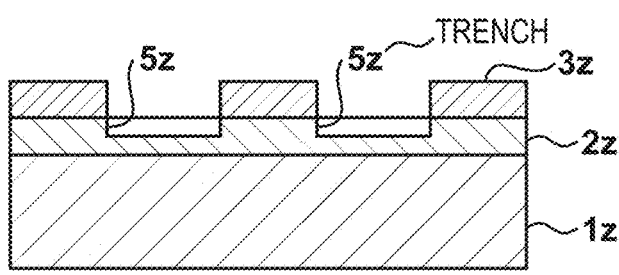
Figure 10F:
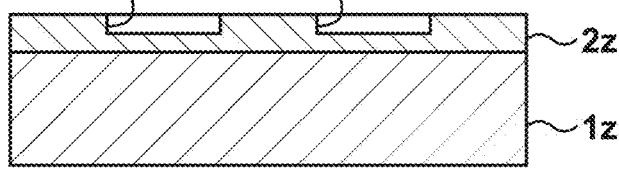

As shown in of FIG. 10E, out of the surface of the processing target material $2z$, portions without any cured product or portions where the cured products remain thin are removed to form trenches $5z$ by performing etching using the pattern of the cured product as an etching resistant mask. As shown in FIG. 10F, an article having the trenches $5z$ formed in the surface of the processing target material $2z$ can be obtained by removing the pattern of the cured product. The pattern of the cured product is removed here. However, the pattern of the cured product may be used as, for example, an interlayer dielectric film included in the semiconductor element or the like, that is, the constituent member of the article without removing it after processing.

Note that each of the above embodiments has explained the imprint apparatus using a mold in which a pattern is formed. However, these are merely exemplary embodiments of the present invention. The present invention is also applicable to a planarizing apparatus (molding apparatus) that planarizes a composition by molding the composition using a mold on a flat plate having no three-dimensional structure while the mold is in contact with the composition on the substrate, and curing the composition.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-162694, filed Aug. 25, 2017, and Japanese Patent Application No. 2018-129469, filed Jul. 6, 2018, which are hereby incorporated by reference herein in their entirety.

What is claimed is:

1. An imprint apparatus that utilizes a mold to form a pattern of an imprint material on a pattern formation region of a member by contacting a pattern region of the mold with the imprint material on the pattern formation region of the member, the imprint apparatus comprising:
   a dispenser configured to dispense the imprint material onto the pattern formation region of the member and a non-pattern formation region of the member, the non-pattern formation region being disposed outside the pattern formation region such that no portion of the imprint material on the non-pattern formation region contacts the pattern region of the mold when the pattern region of the mold contacts the imprint material on the pattern formation region of the member;
   a detector configured to detect the imprint material dispensed onto the non-pattern formation region by the dispenser; and
   a controller configured to perform processing for determining whether or not an abnormality exists in the dispenser,
   wherein the detector is configured to detect the imprint material dispensed onto the non-pattern formation region after the imprint material on the pattern formation region and the pattern region of the mold start to contact each other,
   the controller is configured to obtain a detection result of the imprint material on the non-pattern formation region detected by the detector after the imprint material on the pattern formation region and the pattern region of the mold start to contact each other,
   the controller is configured to perform the processing for determining whether or not the abnormality exists in the dispenser based on the detection result of the imprint material on the non-pattern formation region, and
   in a case where the abnormality in the dispenser exists, the controller is configured to execute processing of recovering a function of the dispenser.

2. The imprint apparatus according to claim 1, wherein the dispenser is configured to dispense the imprint material onto the pattern formation region in accordance with a first map, and to dispense the imprint material onto the non-pattern formation region in accordance with a second map different from the first map.

3. The imprint apparatus according to claim 1, wherein the dispenser is configured to dispense the imprint material onto the non-pattern formation region using a plurality of nozzles configured to discharge the imprint material onto the pattern formation region.

4. The imprint apparatus according to claim 1, wherein the dispenser is configured to dispense the imprint material onto the pattern formation region and the non-pattern formation region by discharging the imprint material in a state in which a driving mechanism continuously scans the member in a predetermined direction.

5. The imprint apparatus according to claim 1, wherein the processing for determining whether or not the abnormality exists in the dispenser includes processing of detecting, among a plurality of nozzles of the dispenser, a nozzle that cannot discharge the imprint material.

6. The imprint apparatus according to claim 1, wherein the processing for determining whether or not the abnormality exists in the dispenser includes processing of detecting, among a plurality of nozzles of the dispenser, a nozzle whose discharge amount of the imprint material is abnormal.

7. The imprint apparatus according to claim 1, wherein the controller is configured to execute the processing for determining whether or not the abnormality exists in the dispenser based on the detection result of the imprint material dispensed onto the non-pattern formation region detected by the detector in a state in which the imprint material on the pattern formation region is in contact with the pattern region.

8. The imprint apparatus according to claim 1, wherein the controller is configured to execute the processing for determining whether or not the abnormality exists in the dispenser based on the detection result of the imprint material dispensed onto the non-pattern formation region detected by the detector before the imprint apparatus cures the imprint material on the pattern formation region and after the imprint apparatus brings the imprint material on the pattern formation region and the entire pattern region into contact with each other.

9. The imprint apparatus according to claim 1, wherein the controller is configured to execute the processing for determining whether or not the abnormality exists in the dispenser based on the detection result of the imprint material dispensed onto the non-pattern formation region detected by the detector during a period in which the imprint apparatus cures the imprint material on the pattern formation region.

10. The imprint apparatus according to claim 1, wherein the controller is configured to execute the processing for determining whether or not the abnormality exists in the dispenser based on the detection result of the imprint material dispensed onto the non-pattern formation region detected by the detector during a period in which the imprint apparatus separates the pattern region and cured imprint material on the pattern formation region from each other.

11. The imprint apparatus according to claim 1, wherein the controller is configured to execute the processing for determining whether or not the abnormality exists in the dispenser based on the detection result of the imprint material dispensed onto the non-pattern formation region detected by the detector before relative positions of the member and the mold are changed with respect to a direction parallel to the pattern formation region and after the pattern region and cured imprint material on the pattern formation region are separated from each other.

12. The imprint apparatus according to claim 1, wherein the processing for determining whether or not the abnormality exists in the dispenser includes processing of displaying, on a display, the detection result of the imprint material dispensed onto the non-pattern formation region detected by the detector, and prompting an operator to determine the presence/absence of the abnormality in the dispenser.

13. The imprint apparatus according to claim 1, wherein
   the detector includes an image capturing device configured to capture the non-pattern formation region in a state the imprint material has been dispensed onto the pattern formation region and the non-pattern formation region by the dispenser, and
   the controller is configured to perform the processing for determining whether or not the abnormality exists in the dispenser based on an image of the non-pattern formation region captured by the image capturing device.

14. The imprint apparatus according to claim 13, wherein the detector is configured to capture the pattern formation region in addition to the non-pattern formation region, and
the controller is configured to detect, based on the image of the non-pattern formation region and an image of the pattern formation region both of which have been captured by the image capturing device, an abnormality in forming the pattern of the imprint material on the pattern formation region.

15. The imprint apparatus according to claim 1, wherein the member includes a base portion and a mesa portion that protrudes from the base portion, and a surface of the mesa portion forms the pattern formation region which is a single pattern formation region provided to the member.

16. The imprint apparatus according to claim 1, wherein the member includes a base portion and a mesa portion that protrudes from the base portion, and the base portion includes the non-pattern formation region.

17. The imprint apparatus according to claim 1, wherein the member includes a plurality of pattern formation regions including the pattern formation region, and the non-pattern formation region is a scribe line region between the plurality of pattern formation regions.

18. The imprint apparatus according to claim 1, wherein when the controller determines the abnormality in the dispenser exists, in a case where the imprint material on the pattern formation region is not cured, the imprint apparatus cures the imprint material, and the imprint apparatus unloads the member after the cured imprint material and the mold are separated from each other.

19. The imprint apparatus according to claim 1, wherein the controller has a function of setting whether to execute the processing for determining whether or not the abnormality exists in the dispenser.

20. The imprint apparatus according to claim 1, wherein the detector is configured to detect the non-pattern formation region via the mold.

21. The imprint apparatus according to claim 1, wherein the detector includes a detecting device configured to detect an alignment mark of the mold and an alignment mark of the member,
the detecting device is configured to detect the non-pattern formation region, and
the controller is configured to perform the processing for determining whether or not the abnormality exists in the dispenser based on the detection result of the imprint material dispensed onto the non-pattern formation region detected by the detecting device.

22. The imprint apparatus according to claim 1, wherein the detector includes:
an image capturing device configured to capture the non-pattern formation region in a state in which the imprint material has been dispensed onto the pattern formation region and the non-pattern formation region by the dispenser, and
a detecting device configured to detect an alignment mark of the mold and an alignment mark of the member, and
a region where the detecting device performs detection is different from the non-pattern formation region where the image capturing device performs image capturing.

23. The imprint apparatus according to claim 22, wherein the detecting device is configured to perform image capturing by dark field observation, and the image capturing device is configured to perform image capturing by bright field observation.

24. The imprint apparatus according to claim 21, wherein the detecting device is configured to detect the non-pattern formation region before the imprint material on the pattern formation region and the mold are brought into contact with each other, and in a case where the controller determines the abnormality exists in the dispenser based on the detection result detected by the detecting device before the imprint material on the pattern formation region and the mold are brought into contact with each other, the controller is configured to cause the imprint apparatus to cure the imprint material without bringing the imprint material on the pattern formation region and the mold into contact with each other.

25. An article manufacturing method comprising:
forming a pattern on a member using an imprint apparatus defined in claim 1; and
performing processing of the member on which the pattern is formed in the forming,
wherein an article is manufactured from the member having undergone the processing.

26. An imprint method of forming a pattern of an imprint material by curing the imprint material in a state in which the imprint material on a pattern formation region of a member, where the pattern is to be formed, is in contact with a pattern region of a mold, the method comprising:
causing a dispenser to dispense the imprint material onto the pattern formation region of the member and a non-pattern formation region of the member, the non-pattern formation region being disposed outside the pattern formation region such that no portion of the imprint material on the non-pattern formation region contacts the pattern region of the mold when the pattern region of the mold contacts the imprint material on the pattern formation region of the member;
detecting, by a detector, the imprint material dispensed onto the non-pattern formation region by the dispenser after the imprint material on the pattern formation region and the pattern region of the mold start to contact each other;
obtaining, by a controller configured to perform processing for determining whether or not an abnormality exists in the dispenser, a detection result of the detecting, performed by the detector, of the imprint material dispensed onto the non-pattern formation region after the imprint material on the pattern formation region and the pattern region of the mold start to contact each other;
performing, by the controller, the processing for determining whether or not the abnormality exists in the dispenser based on the detection result; and
executing, by the controller in a case where the abnormality in the dispenser exists, processing of recovering a function of the dispenser.

27. A molding apparatus for molding a composition by performing processing of curing the composition in a state in which the composition on a member is in contact with a mold, and separating the composition and the mold from each other, the apparatus comprising:
a dispenser configured to dispense the composition onto a first region of the member and a second region of the member, the second region being disposed outside the first region such that no portion of the composition on the second region contacts a pattern region of the mold when the pattern region of the mold contacts the composition on the first region of the member;

a detector configured to detect the composition dispensed onto the second region of the member by the dispenser; and a controller configured to perform processing for determining whether or not an abnormality exists in the dispenser, wherein the detector is configured to detect the composition dispensed onto the second region after the dispensed composition on the first region and the pattern region of the mold start to contact each other, the controller is configured to obtain a detection result of the dispensed composition on the second region detected by the detector after the dispensed composition on the first region and the pattern region of the mold start to contact each other, the controller is configured to perform the processing for determining whether or not the abnormality exists in the dispenser based on the detection result of the dispensed composition on the second region, and in a case where the abnormality in the dispenser exists, the controller is configured to execute processing of recovering a function of the dispenser.

28. A molding method of molding a composition by performing processing of curing the composition in a state in which the composition on a member is in contact with a mold, and separating the composition and the mold from each other, the method comprising:

causing a dispenser to dispense the composition onto a first region of the member and a second region of the member, the second region being disposed outside the first region such that no portion of the composition on the second region contacts a pattern region of the mold when the pattern region of the mold contacts the composition on the first region of the member;

detecting, by a detector, the composition dispensed onto the second region of the member by the dispenser after the dispensed composition on the first region and the pattern region of the mold start to contact each other;

obtaining, by a controller configured to perform processing for determining whether or not an abnormality exists in the dispenser, a detection result of the detecting, performed by the detector, of the dispensed composition on the second region after the dispensed composition on the first region and the pattern region of the mold start to contact each other;

performing, by the controller, the processing for determining whether or not the abnormality exists in the dispenser based on the detection result of the dispensed composition on the second region; and executing, by the controller in a case where the abnormality in the dispenser exists, processing of recovering a function of the dispenser.

* * * * *